United States Patent [19]
Parr

[11] Patent Number: 5,627,859
[45] Date of Patent: May 6, 1997

[54] TIME-REVERSED INFINITE IMPULSE RESPONSE DIGITAL FILTERING

[75] Inventor: Michael Parr, San Diego, Calif.

[73] Assignee: Huges Electronics, Los Angeles, Calif.

[21] Appl. No.: 273,661

[22] Filed: Jul. 11, 1994

[51] Int. Cl.⁶ .................................................... H03H 7/30
[52] U.S. Cl. ........................................ 375/229; 375/350
[58] Field of Search .................................. 375/350, 229, 375/230, 316; 364/724.19, 724.2, 724.16; 348/614, 607; 455/33.1; 379/59; 333/18, 28 R

[56] References Cited

U.S. PATENT DOCUMENTS

| | | | |
|---|---|---|---|
| 5,023,940 | 6/1991 | Johnson et al. | 375/350 |
| 5,117,291 | 5/1992 | Fadavi-Ardekani et al. | 348/614 |
| 5,274,670 | 12/1993 | Serizawa et al. | 375/231 |
| 5,318,036 | 6/1994 | Arand et al. | 128/696 |
| 5,371,762 | 12/1994 | Amrany et al. | 375/350 |
| 5,402,795 | 4/1995 | Reichl | 128/696 |
| 5,406,955 | 4/1995 | Bledsoe et al. | 128/711 |

FOREIGN PATENT DOCUMENTS

| | | |
|---|---|---|
| 0323870 | 7/1989 | European Pat. Off. . |
| 5235702 | 9/1993 | Japan . |

OTHER PUBLICATIONS

Ariyavisitakul, "Equalization of a Hard-Limited Slowly-Fading Multipath Signal Using a Phase Equalizer with a Time-Reversal Structure", *IEEE Vehicular Technology Conference*, Orlando, Florida, May 6-9, 1990, pp. 520-526.

Scott R. Powell and Paul M. Chau A Technique for Realizing Linear Phase IIR Filters IEEE Transactions on Signal Processing, vol. 39, No. 11, Nov. 1991.

*Primary Examiner*—Tesfaldet Bocure
*Attorney, Agent, or Firm*—John T. Whelan; Wanda Denson-Low

[57] ABSTRACT

A digital filter includes a first memory device, a filter with at least one pole, i.e., a pole filter, coupled to the first memory device, and a second memory device coupled to the pole filter. The first memory device sequentially stores a digital signal in a forward sequence, and the pole filter sequentially reads the stored digital signal from the first memory device in a reverse sequence, thereby creating a time-reversed signal. The time-reversed signal is filtered by the pole filter, and is then stored as a filtered time-reversed signal in the second memory device in the forward sequence. A data signal is generated by the second memory device by reading the filtered time-reversed signal from the second memory device in the reverse sequence.

17 Claims, 3 Drawing Sheets

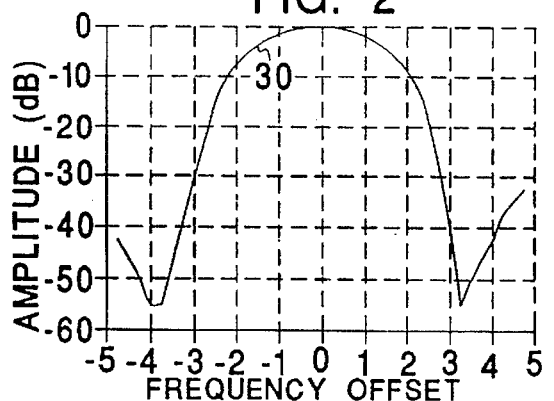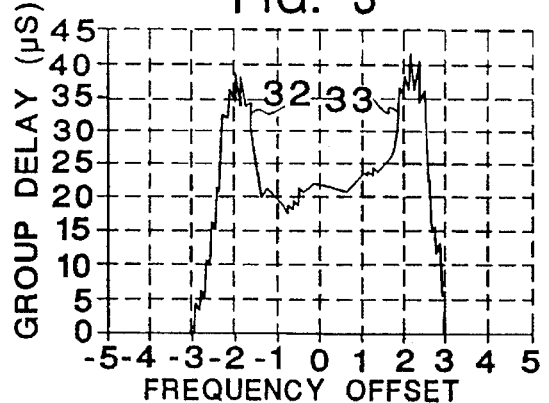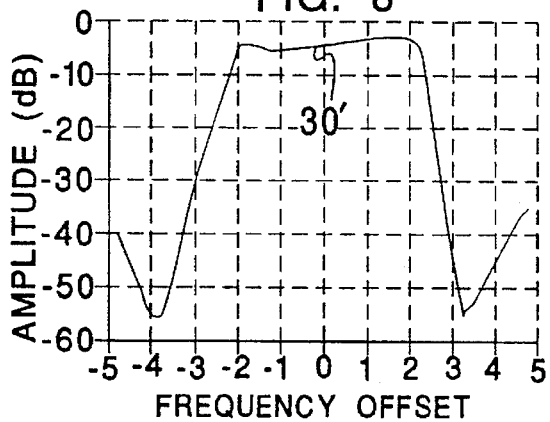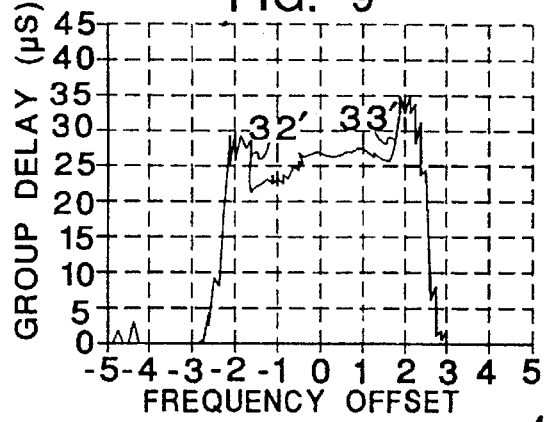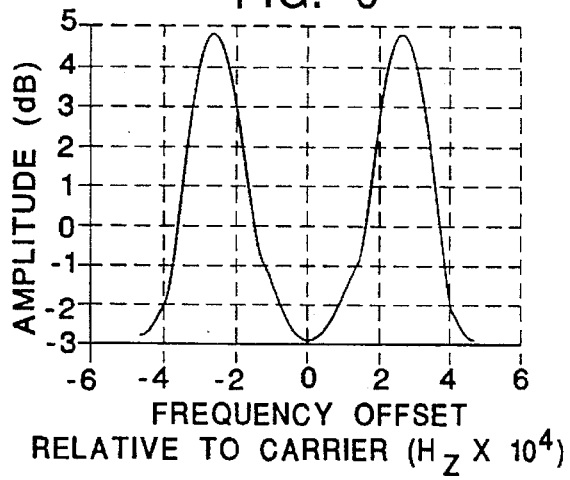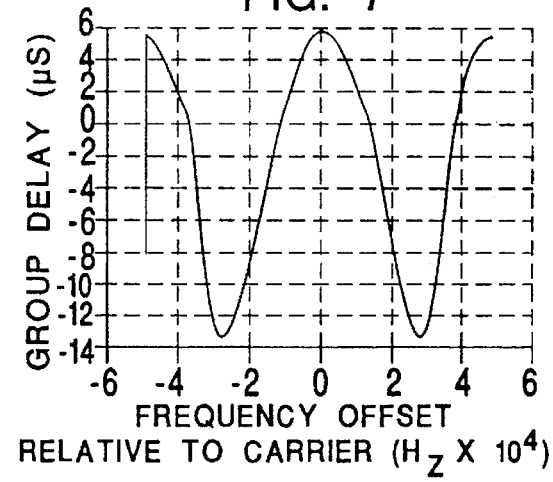

TIME-REVERSED INFINITE IMPULSE RESPONSE DIGITAL FILTERING

BACKGROUND OF THE INVENTION

The present invention relates to discrete-time or digital filters. Even more particularly, the present invention relates to a time-reversed infinite impulse response digital filter device and method, wherein time-domain asymmetric signal can be filtered by the time-reversed infinite impulse response filter so as to generate a time-domain symmetric signal or signal having linear phase, in response thereto.

In a receive signal path, e.g., in a cellular telephone, a digital filter, or discrete-time filter, can be utilized to filter a received signal and to implement a response desired for further processing of the received signal, e.g., in a digital signal processor. Unfortunately, before the received signal is filtered by the discrete-time filter, the received signal is typically filtered by an analog filter in order to band-limit the received signal by filtering out undesirable frequency bands, e.g., frequency bands other than a desired cellular frequency band, such as adjacent cellular frequency bands. Problematically, the analog filter distorts the received signal, and generates a time-domain asymmetric signal.

As used herein, the term time-domain asymmetric signal, refers to a signal that is the output signal of an asymmetric electrical circuit. The asymmetric electrical circuit is a circuit that, in response to an electrical impulse or delta function, generates an output signal, i.e., impulse response, that is not symmetric about any point in time. Typically the impulse response has more energy following its time domain peak than proceeding it. In other words, the impulse response builds more quickly than it decays. For example, the impulse response may be an oscillating signal that is generated in response to the electrical impulse, and that dissipates (or decays) over time. As a result, the oscillating signal has a time-domain energy distribution wherein very little energy is distributed before its peak, and a greater amount of energy is distributed after its peak. This type of energy distribution can also be described as lacking linear phase.

Because analog filters are infinite impulse response filters, they are one type of asymmetric electrical circuit. Thus, the output signal generated by the analog filter, mentioned above, is referred to herein as the "asymmetric" signal, i.e., a signal that has been asymmetrically distorted by the analog filter.

Two types of discrete-time, or digital, filters are characterized based on their response to an electrical impulse, or delta function: finite impulse response filters (or FIR filters) and infinite impulse response filters (or IIR filters). The infinite impulse response filter exhibits asymmetric distortion (or lack of linear phase) similar to that of the analog filter described above. Because the IIR filter tends to asymmetrically distort the asymmetric signal, described above, and therefore tends to compound the asymmetric distortion caused by the analog filter, the IIR filter has, heretofore, not been a preferred filter for use in the cellular telephone receive signal path, where a symmetric output signal (i.e., an output signal free from asymmetric distortion, or having linear phase) is desired.

In theory, the FIR filter, however, can be designed to completely restore the distortions made by the analog filter, i.e., can be designed to generate a symmetric signal in response to the asymmetric signal. Problematically, in order to achieve this design an infinite number of unit delays and "taps" must be utilized, and an infinite amount of time is needed for an output signal, completely free from distortion, to be generated. Thus, as a practical matter, the FIR filter cannot completely restore the distortions made by the analog filter.

Instead, FIR filters used in receive signal paths where a symmetric output signal is desired are typically designed to restore the distortions made by the analog filter to within a prescribed tolerance. As a result, the FIR filter can be designed with, e.g., eight unit delays and sixteen "taps" which is considered reasonable for, e.g., the processing of cellular telephone signals. Additional delays and taps may be utilized to increase the symmetry of the FIR filter's impulse response.

Improved or complete restoration of the distortions introduced by the analog filter, without the need for additional delays and taps, is however very desirable.

Thus, improvements are needed in the filtering of electrical signals so as to, e.g., restore distortions introduced into the electrical signal by an asymmetric electrical circuit, such as an analog filter.

SUMMARY OF THE INVENTION

The present invention provides a time-reversed filter, and a method of using the same, wherein, e.g., an asymmetric signal can be filtered by the time-reversed filter so as to generate a symmetric signal in response thereto.

The invention can be characterized as a device for digitally filtering a digital signal. The device includes (1) a first memory device, (2) a pole filter having a pole and being coupled to the first memory device and (3) a second memory device coupled to the pole filter. Note that the term pole filter, as used herein should not be confused with the term all-pole filter, which implies a filter having no zeros. The term pole filter means a filter having at least one pole, and possibly having one or more zeros.

The first memory device stores the digital signal in a forward sequence such that a first sample within the digital signal is stored first within the first memory device, and a last sample within the digital signal is stored last within the first memory device. The first sample can be the first sample in a burst-wise digital signal, as is used for example in time-division multiple access (TDMA) encoded cellular telephone signals, or may be any sample within a continuous stream of digital samples or within a burst of digital samples. Similarly, the last sample may be the last sample in a burstwise digital signal, or may be any sample within a continuous stream of digital samples or within a burst of digital samples. The pole filter, which may be a digital infinite impulse response (IIR) filter, reads the stored digital signal from the first memory device in a reverse sequence such that the last sample is read first from the first memory device, and the first sample is read last from the first memory device, thereby creating a time-reversed signal. The time-reversed signal is digitally filtered by the pole filter, and is then stored in a second memory device in the forward sequence. Finally, the time-reversed signal, having been filtered by the pole filter, is read from the second memory device in the reverse sequence. A substantially symmetric data signal is generated by the second memory device in response to the reading of the filtered time-reversed signal in the reverse sequence.

The invention may also be characterized as a method of digitally filtering a digital signal. The method includes (a) storing sequentially the digital signal in a forward sequence such that a first sample within the digital signal is stored first, and a last sample within the digital signal is stored last; and (b) filtering the digital signal in a reverse sequence such that the last sample is filtered first, and the first sample is filtered last. The filtering may be performed using any filter having a pole, such as a digital IIR filter or an analog filter having a pole. The method also includes (c) storing the digital signal, having been filtered, in the forward sequence; and (d) generating a data signal by retrieving the stored filtered digital signal in the reverse sequence.

BRIEF DESCRIPTION OF THE DRAWINGS

The above and other aspects, features and advantages of the present invention will be more apparent from the following more particular description thereof, presented in conjunction with the following drawings wherein:

FIG. 2 is a graph of amplitude frequency response to the analog filter of FIG. 1, wherein frequency offset relative to a carrier frequency is shown on a horizontal axis and amplitude is shown on a vertical axis;

FIG. 3 is a graph of group delay frequency response to the analog filter of FIG. 1, wherein frequency offset relative to the carrier frequency is shown on a horizontal axis and group delay is shown on a vertical axis;

FIG. 6 is a graph of the amplitude frequency response of the digital filter of FIG. 1, wherein frequency offset relative to a carrier frequency is shown on a horizontal axis and amplitude is shown on a vertical axis;

FIG. 7 is a graph of the group delay frequency response of the digital filter of FIG. 1, wherein frequency offset relative to a carrier frequency is shown on a horizontal axis and group delay is shown on a vertical axis;

FIG. 8 is a graph of amplitude frequency response to a combination of the analog filter and the digital filter of FIG. 1, wherein frequency offset relative to a carrier frequency is shown on a horizontal axis and amplitude is shown on a vertical axis; and FIG. 9 is a graph of group delay frequency response to the combination of the analog filter and the digital filter of FIG. 1, wherein frequency offset relative to a carrier frequency is shown on a horizontal axis and group delay is shown on a vertical axis.

Corresponding reference characters indicate corresponding components throughout the several views of the drawings.

DETAILED DESCRIPTION OF THE INVENTION

Figure 1:
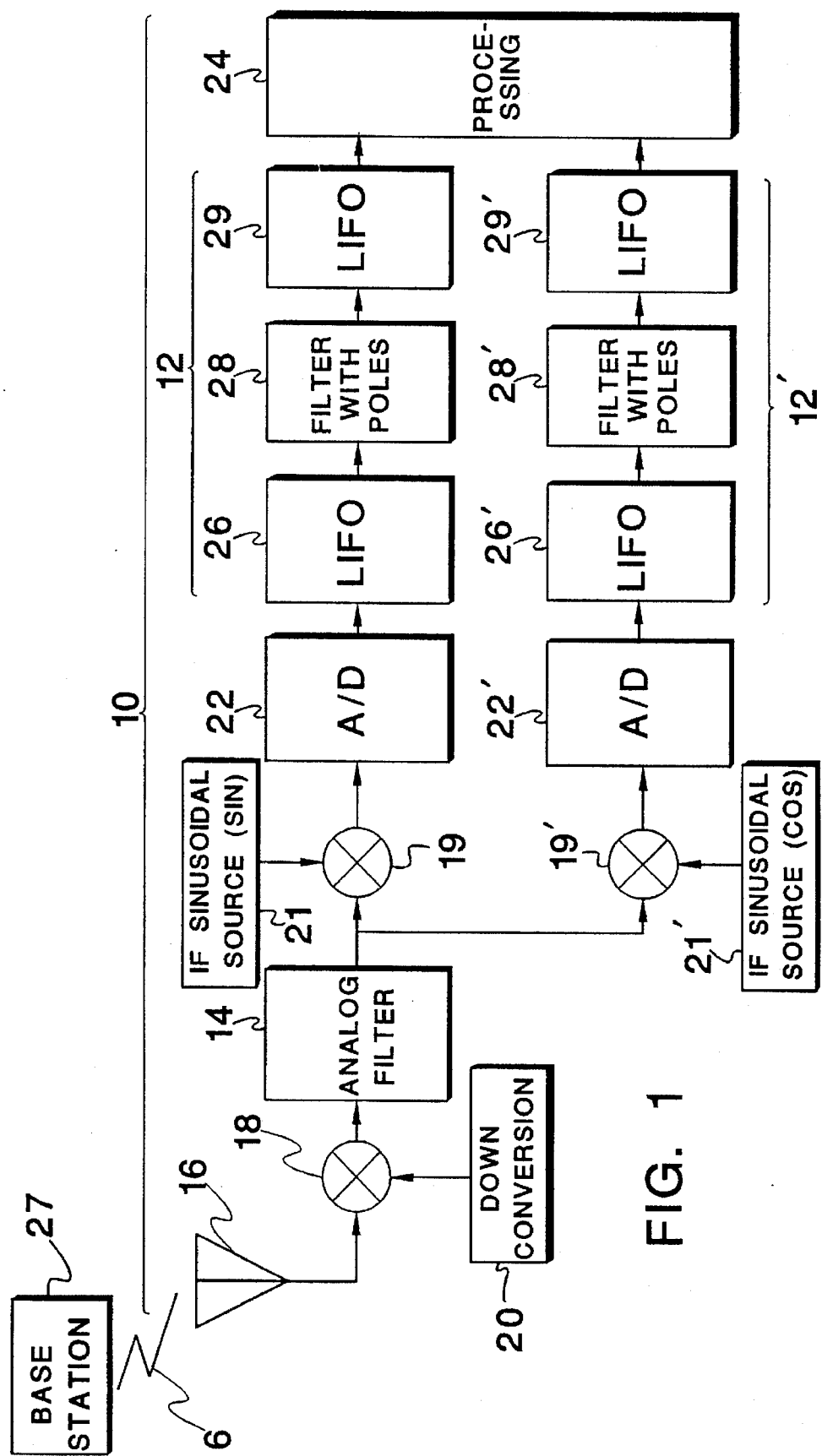
FIG. 1 is a block diagram of a receive signal path for use in a cellular telephone, wherein a digital filter made in accordance with the present invention is utilized to restore distortions that are introduced by an analog filter.

The following description of the presently contemplated best mode of practicing the invention is not to be taken in a limiting sense, but is made merely for the purpose of describing the general principles of the invention. The scope of the invention should be determined with reference to the claims.

Referring first to FIG.. 1, a block diagram is shown of a receive signal path 10 for use in a cellular telephone, wherein a digital filter 12 made in accordance with the present invention is utilized to restore distortions that are introduced by an analog filter 14.

An antenna 16 is shown coupled to a first input of a multiplier (or multiplexer) 18, and a down conversion frequency generator 20 is shown coupled to a second input of the multiplier 18. In practice, the multiplier 18 and down conversion frequency generator 20 carry out a demodulation process from carrier frequencies to baseband, but are described here conceptually. Typically, multiple demodulation stages consisting of multiple multipliers and down conversion frequency generators, and multiple intermediate filters are utilized. As shown, a carrier frequency cellular signal is received into the antenna 16 and demodulated to a lower intermediate frequency (IF) signal, which passes through the analog filter 14. Subsequently, the IF signal is reduced to baseband by first and second demodulation circuits 19, 21, 19', 21'. Such multiple demodulation stages are known in the art and are therefore not described in detail herein.

An output of the multiplier is coupled to the analog filter 14, which is coupled to the first and second demodulation circuits 19, 21, 19', 21'. The first and second demodulation circuits 19, 21, 19', 21' include first and second multipliers 19, 19', which are coupled to the analog filter 14 and to analog to digital converters 22, 22'. The multipliers 19, 19' are also coupled to first and second demodulation frequency generators 21, 21', so as to combine first and second demodulation signals with the output of the analog filter 14, as is known in the art. The first demodulation circuit is coupled to the analog to digital converter (ADC) 22, and the ADC 22 is coupled to the digital filter 12. The digital filter 12 is coupled to a signal processor 24. Together the antenna 16, the multiplier 18, the analog filter 14, the first demodulation circuit 19, 21, the ADC 22, the digital filter 12, and the signal processor 24 comprise an "I" channel of the receive signal path 10.

A "Q" channel of the receive signal path 10 consists of the antenna 16, the multiplier 18, the analog filter 14, the second demodulation circuit 19', 21', another ADC 22', another digital filter 12', and the signal processor 24. The "Q" channel functions in a manner similar to the "I" channel except that it is orthogonal to the "I" channel, because the second demodulation signal is 90° out of phase from the first demodulation signal. Therefore, only the "I" channel is described hereinbelow. The use of orthogonal "I" and "Q" channels is well known in the cellular communications art.

In operation, the antenna 16 receives a cellular signal 6 via radio frequency air waves. The cellular signal 6 is generated at a base station 27 as is known in the art of cellular telephone communications. The cellular signal 6 is a burstwise signal, i.e., it is transmitted by the base station 27 in a plurality of signal bursts consisting of finite blocks of information. Each of the plurality of bursts is received by the antenna 16, and is passed into the receive signal path 10 as it is received.

The cellular signal 6 is passed by the antenna 16 to the multiplier 18 where it is multiplied by a down conversion frequency signal from the down conversion frequency generator 20. The receiver signal is then passed to the analog filter 14. As is known in the art, there can be, and generally are, several multipliers, several down conversion frequency generators, and several analog filters within the receive signal path 10. The multiplier 18, the down conversion frequency generator 20 and the analog filter 14 of FIG. 1 are shown merely as an example of the multipliers, down conversion frequency generators and analog filters that are commonly used in the receive signal path 10 of a cellular telephone.

Unfortunately, in addition to filtering unwanted signals from the receiver signal, such as adjacent-band cellular signals, the analog filter 14 causes asymmetric distortion in the receiver signal and generates an asymmetric signal, as defined hereinabove.

The asymmetric signal is demodulated by the first demodulator 19, 21 and digitized, i.e., sampled, as is known in the art, by the ADC 22. The ADC 22 generates an asymmetric data signal (or digital signal) in response to the demodulating and sampling of the asymmetric signal. The asymmetric data signal includes several binary samples, which include voltages that represent binary digits (i.e., bits). The binary samples correspond to the time-domain voltage amplitudes of the asymmetric signal and consist of, e.g., sixteen bit words.

The asymmetric data signal is passed into the digital filter 12, which in the preferred embodiment is referred to as a time-reversed infinite impulse response filter 12. The time-reversed infinite impulse response filter 12 includes a first memory device 26, namely a first last-in-first-out (LIFO) buffer 26, an infinite impulse response (IIR) filter 28, and a second memory device 29, namely a second last-in-first-out (LIFO) buffer 29. The first LIFO buffer 26 receives each sample of the asymmetric data signal from the ADC 22 as each sample is generated by the ADC 22. The first LIFO buffer 26 stores each sample at a memory location within the first LIFO buffer 26.

After the last sample within one of the plurality of signal bursts is stored in the first LIFO buffer 26, the last sample is passed from the first memory to the IIR filter 28. Next, the second-to-last sample is passed to the IIR filter 28, then the third-to-last sample is similarly passed, and so on until the first sample is passed to the IIR filter 28. Thus, the samples of each signal burst are passed to the IIR filter 28 in a reverse sequence, i.e., in reverse of the order in which they are received into the first LIFO buffer 26. The samples, in the reverse sequence, are referred to herein as a time-reversed signal. Next, the IIR filter 28 filters the time-reversed signal and causes asymmetric distortion of the time-reversed signal.

Note that while a digital IIR filter 28 is a preferred filter for use with the invention, many other types of filters with one or more poles (referred to herein as pole filters) should be understood to be within the scope of the invention. For example, an analog filter can be used (provided a digital to analog converter is interposed between the first LIFO buffer 26 and the analog filter, and, similarly, a analog to digital converter is interposed between the analog filter and the second LIFO buffer 29). Alternatively, a digital lattice structure with feedback can also be used as the pole filter.

After having been filtered by the IIR filter 28, the time-reversed signal is passed into the second LIFO buffer 29. After the last sample within one of the plurality of signal bursts of the filtered time-reversed signal is stored within the second LIFO buffer 29, the samples are read from the second LIFO buffer 29 in the reverse sequence, i.e., last sample, then second-to-last sample, etc., and a substantially symmetric data signal is generated in response thereto. This process, i.e., reversing, IIR filtering and then re-reversing, is repeated for each of the plurality of signal bursts within the asymmetric data signal.

Note that in the event a the digital filter 12 is used in a system that does not utilize a burstwise incoming signal such as the cellular signal 6, the incoming signal will need to be segmented or blocked so that discrete bursts or blocks of the signal can be stored in the first LIFO 26 and recalled using the reverse sequence, etc.

The IIR filter 28, as mentioned above, causes asymmetric distortion in the asymmetric data signal. However, because each burst (or block) of the asymmetric data signal is received into the IIR filter 28 in reverse, i.e., last sample first etc., filtered by the IIR filter 28 and then re-reversed, the asymmetric distortion caused by the IIR filter 28 surprisingly tends to cause the asymmetric data signal to become symmetric. By adjusting the asymmetric distortion caused by the IIR filter 28, the IIR filter 28 can be made to generate a substantially symmetric data signal. (A symmetric signal is a signal produced by a filter or combination of filters that have a substantially symmetric energy distribution about a time-domain peak in the filter's impulse response.) Finally, the substantially symmetric data signal is passed to the signal processor 24, and is processed therein, along with a similar symmetric data signal from the "Q" channel, as is known in the art of cellular telephone communications.

In this way the time-reversed infinite impulse response filter 12 restores the asymmetric distortion caused by the analog filter 14 using a digital filter having a sharply reduced number of "taps".

Note that the digital filter of the present invention need not be used to restore symmetry or linear phase to a time-domain asymmetrically distorted signal. The restoration of symmetry is described herein only in the context of describing the function of the preferred embodiment of the digital filter. Numerous other applications of the invention are contemplated and can be achieved through the selection of the pole(s) and possible zero(s) of the pole filter. Such applications include satellite communications modems, telephone line modems, terrestrial microwave point-to-point modems and numerous other applications.

Referring next to FIG. 2, a graph is shown of the amplitude frequency response to the analog filter 14 of FIG. 1, wherein frequency offset relative to a carrier frequency is shown on a horizontal axis and amplitude is shown on a vertical axis. As can be seen, the amplitude frequency response has a generally rounded amplitude (frequency-domain) profile 30 between approximately −15 and +15 kHz from the center frequency of the analog filter (i.e., the intermediate frequency (IF)).

Referring to FIG. 3, a graph is shown of group delay frequency response to the analog filter 14 of FIG. 1, wherein frequency offset relative to the carrier frequency is shown on a horizontal axis and group delay is shown on a vertical axis. Pronounced peaks 32, 33 in group delay, i.e., around 40 μS, can be seen at approximately −15 and +15 kHz from the center frequency of the analog filter. These peaks are indicative of the asymmetric (time-domain) distortion in the asymmetric signal.

Ideally, both the amplitude (FIG. 2) and group delay (FIG. 3) responses would be constant across the frequency band of interest, i.e., between approximately −15 and +15 kHz from the center frequency of the analog filter. One useful statistic used in interpreting the analog filter's response in a digital modulation environment is the RMS (square-root means of the squares) phase error that the filter imposes on ideally modulated signals, as observed at an output of the receive signal path. For example, for QPSK systems, such as are commonly used in cellular telephone communications, the RMS phase error should be kept to a maximum of approximately two degrees.

In order to improve the RMS phase error, two improvements to the frequency response can be made. The first is to flatten the amplitude response. Typically, this can be achieved through the selection of appropriate pole and zero locations in a 'z'-domain filter model. Poles can be placed near regions requiring more gain, and zero's near those requiring more attenuation.

With IIR filters, flexibility in location of poles is limited by the need for stability. This limitation heretofore tended to correspond in the time-domain to asymmetry in the filter's impulse response, with more energy coming after the peak—thus, tending to exaggerate the asymmetry caused by analog filters such as the analog filter 14 of FIG. 1, instead of improving it. Viewed another way, this corresponds to increases in group delay at higher frequencies.

The second desired improvement in frequency response is to flatten the group delay (giving the filter fixed delay as a function of frequency, a property called linear phase).

To have flexibility in control of group delay has heretofore implied the use of an FIR (finite impulse response) filter where only zeros (and no poles) are available for placement. Stability is not a problem, so zero location is flexible and group delay as well as amplitude response can be successfully manipulated. To equalize for the effect of analog filters like those in FIG. 1, the impulse response of a properly designed FIR filter will be asymmetric with more energy preceding the peak. Problematically, as described above, such FIR filters cannot completely correct for the asymmetric distortion caused by, e.g., the analog filter of FIG. 1.

The invention consists of a filter having a pole, or pole filter, such as an digital IIR filter, which achieves the goal of placing more energy before the peak of the impulse response, or equivalently, creating a reduction in group delay with frequency. In the z-domain, this corresponds to enabling the placement of poles outside the unit circle. FIGS. 6 and 7 illustrate preferred amplitude and group delay characteristics, respectively, for the digital filter 12 of the present invention.

The analog filter 14 depicted in FIG. 1, and with characteristics shown in FIGS. 2 and 3, results in 3.09 degrees RMS phase error. By further filtering the asymmetric signal from the analog filter 14 with the digital filter 12 of the present invention, RMS phase error is reduced to 1.03 degrees.

Figure 4:
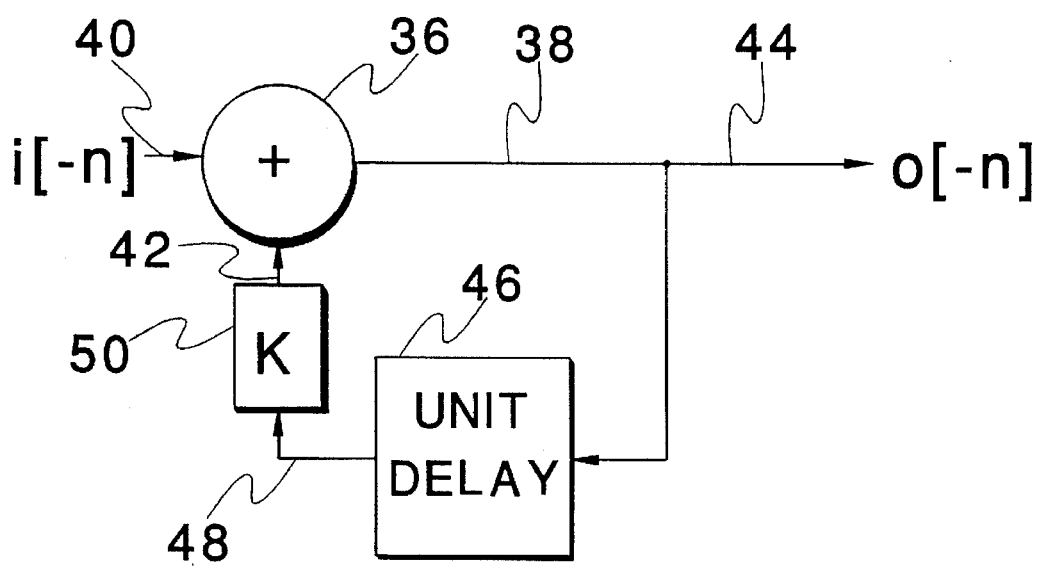
FIG. 4 is a schematic view of one embodiment of the digital filter of FIG. 1.

Referring next to FIG. 4, a schematic view is shown of the IIR filter 28 of FIG. 1.

The time-reversed burst signal is symbolized as i[−n], and the filtered time-reversed burst signal, i.e., the time-reversed burst signal having been filtered by the signal, is symbolized as o[−n]. The independent variable −n represents the sequence of samples within each of the plurality of bursts, having been read from the first LIFO in reverse order— hence the "−" sign.

The asymmetric data signal, having been time reversed, i.e., the time-reversed burst signal 40, enters a summer 36. The summer 36 generates the filtered time-reversed burst signal (i.e., the time-reversed burst signal having been filtered by the IIR filter) in response to the asymmetric data signal 40 and to a feed back signal 42. In order to generate the filtered time-reversed burst signal 38, the feed back signal 42 is added to the time-reversed burst signal 40 by the summer 36. The filtered time-reversed burst signal 38, in addition to serving as an output 44 to the IIR filter 28, is passed from the summer 36 to a unit delay circuit 46. The unit delay circuit 46 delays the symmetric signal 38 for a prescribed time period, e.g. 20.58 μs, and then passes the filtered time-reversed burst signal, having been delayed 48, to a gain circuit 50. The gain circuit 50 attenuates the delayed filtered time-reversed burst signal 48 by an attenuation factor, k, and generates the feedback signal 42 in response thereto. As mentioned above, the feedback signal 42 is added to the time-reversed burst signal 40 in order to generate the filtered time-reversed burst signal 38.

The z-transform for the IIR filter 28 in combination with the first and second LIFOs 26, 29, i.e., the time-reversed infinite impulse response filter 12, can be expressed as follows:

$$H[z] = \frac{1}{1-kz}$$

which has a single pole at:

$$z = \frac{1}{k}$$

and a region-of-convergence at:

$$|z| < \left|\frac{1}{k}\right|$$

Figure 5:
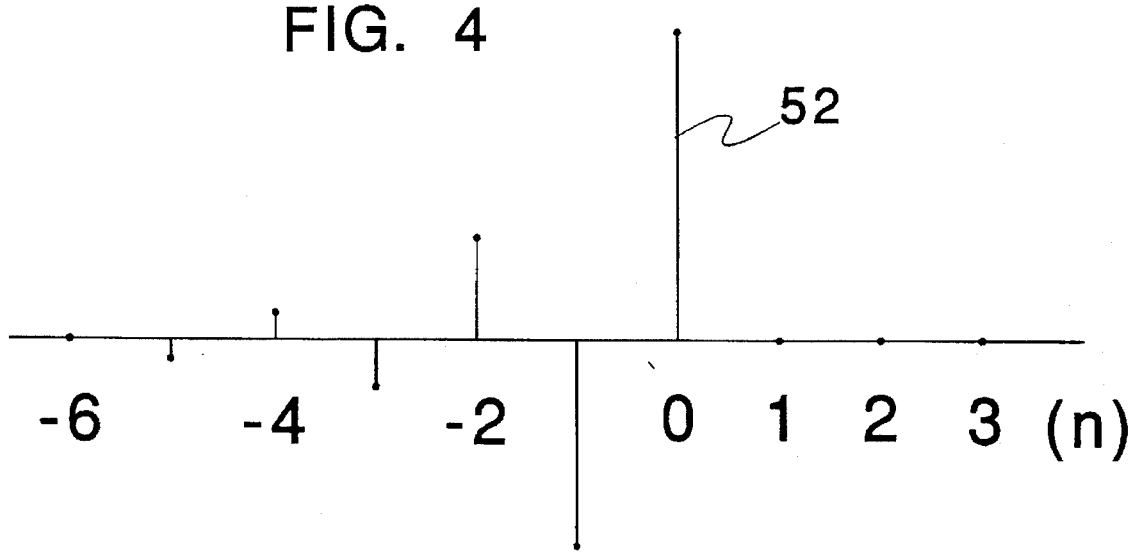
FIG. 5 is a graph of the impulse response of the digital filter of FIG. 1.

This corresponds in the discrete-time domain to the following impulse response:

$$h[n] = u[-n](k)^{-n}$$

which is illustrated in FIG. 5. Note that the impulse response has more energy distributed before its peak 52 than after its peak 52. In order to ensure stable operation (i.e., that the region-of-convergence contains the unit circle), k is limited to lie in the range −1<k<1.

In order to equalize the response depicted in FIG. 2, there is a need to attenuate the response in the low frequency offset areas, and to amplify it at higher frequency offsets. Consequently, it has been found that a high pass filtering structure is desirable, meaning that k should be negative, and lie in the range −1<k<0.

Referring to FIG. 8, a graph is shown of the amplitude frequency response of a combination of the analog filter 14 and the time-reversed infinite impulse response filter 12 of FIG. 1, wherein frequency offset relative to a carrier frequency is shown on a horizontal axis and amplitude is shown on a vertical axis. As can be seen, the amplitude frequency response 30' is significantly flatter than the amplitude frequency response 30 of the analog filter 14 alone, as shown in FIG. 2. Thus, the first desired improvement—flattening the amplitude frequency response—is achieved by the invention.

Similarly, referring to FIG. 9, a graph is shown of the group delay frequency response to the combination of the analog filter 14 and the time-reversed infinite impulse response filter 12 of FIG. 1, wherein frequency offset relative to a carrier frequency is shown on a horizontal axis and group delay is shown on a vertical axis. As can be seen, the group delay frequency response 32', 33' of the analog filter 14 in combination with the time-reversed infinite impulse response filter 12 is also significantly flatter than the group delay frequency response 32, 33 of the analog filter 14 alone, as shown in FIG. 3. Thus, the second desired improvement—flattening the group delay frequency response—is achieved by the invention.

While the invention herein disclosed has been described by means of specific embodiments and applications thereof, numerous modifications and variations could be made thereto by those skilled in the art without departing from the scope of the invention as set forth in the claims.

What is claimed is:

1. A device for digitally filtering a digital signal, the digital signal having a group delay, wherein the device includes:

a first memory device that sequentially stores a portion of the digital signal in a forward sequence such that a first sample within the portion is stored first within the first memory device, and a last sample within the portion is stored last within the first memory device;

a pole filter having at least one pole selected to equalize the digital signal by flattening the group delay of the digital signal, the pole filter being coupled to the first memory device, the pole filter reading the portion from the first memory device in a reverse sequence such that the last sample within the first memory device is read first from the first memory device, and the first sample within the first memory device is read last from the first memory device, wherein a time-reversed signal is generated by the first memory device in response to such reading, the time-reversed signal being filtered by the pole filter, and the pole filter generating a filtered time-reversed signal in response to the filtering of the time-reversed signal; and a second memory device that is coupled to the pole filter and that sequentially stores the filtered time-reversed signal in the forward sequence such that a first sample within the filtered time-reversed signal is stored first within the second memory device, and a last sample within the filtered time-reversed signal is stored last within the second memory device, the second memory device generating a data signal by reading the filtered time-reversed signal in the reverse sequence such that the last signal within the second memory device is read last from the second memory device and the first sample within the second memory device is read first from the second memory device.

2. The device of claim 1 wherein the pole filter is a digital IIR filter.

3. The device of claim 1 further including:

an analog-to-digital converter coupled to said first memory device that digitizes an analog signal and generates said digital signal in response thereto.

4. The device of claim 3 further including:

an analog filter that filters a burstwise signal and generates said analog signal in response thereto, said analog signal being an asymmetric signal, the burstwise signal including a plurality of signal bursts, and said data signal being a substantially symmetric signal.

5. The device of claim 4 further including:

a multiplier coupled to said analog filter, the multiplier generating said burstwise signal in response to a down conversion frequency signal and a cellular signal;

an antenna coupled to the multiplier, the antenna receiving the cellular signal from a base station; and a down conversion frequency generator coupled to the multiplier, the down conversion frequency generator generating the down conversion frequency signal.

6. A method of digitally filtering a digital signal, the digital signal having a group delay wherein the method includes:

(a) storing in a first memory device a portion of the digital signal in a forward sequence such that a first sample within the portion is stored first, and a last sample within the portion is stored last;

(b) generating a time-reversed signal by retrieving the portion from the first memory device in a reverse sequence such that the last sample within the portion is retrieved first, and a first sample within the portion is retrieved last;

(c) filtering the time-reversed signal using a pole filter having at least one pole selected to equalize the digital signal by flattening the group delay of the digital signal, and generating a filtered time-reversed signal in response to the filtering;

(d) storing in a second memory device the filtered time-reversed signal in a forward sequence such that a first sample within the filtered time-reversed signal is stored first, and a last sample within the filtered time-reversed signal is stored last; and (e) generating an output signal by retrieving the filtered time-reversed signal from the second memory device in a reverse sequence such that a last sample within the filtered time-reversed signal is stored first, and a first sample within the filtered time-reversed signal is stored last.

7. The method of claim 6 including said filtering in step (c) using said pole filter, wherein said pole filter is a digital IIR filter.

8. The method of claim 6 further including:

digitizing an analog signal, before said storing step (a), and generating said digital signal in response to the analog signal.

9. The method of claim 8 further including:

filtering analogically a burstwise signal, before said digitizing step, and generating said analog signal in response thereto, the analog signal being an asymmetric signal and said output signal being a substantially symmetric signal.

10. The method of claim 9 further including:

multiplying a cellular signal by a down conversion frequency signal, before said filtering step, and generating said burstwise signal in response thereto.

11. The method of claim 10 further including:

receiving said cellular signal into an antenna, before said multiplying step; and generating said down conversion frequency signal using a down conversion frequency generator, before said multiplying step.

12. A device for digitally filtering a digital signal, the digital signal having a group delay wherein the device includes:

first memory means for storing a portion of the digital signal in a forward sequence such that a first sample within the portion is stored first and a last sample within the portion is stored last;

first retrieving means for generating a time-reversed signal by retrieving the portion from the first memory means in a reverse sequence such that a last sample within the portion is retrieved first, and a first sample within the portion is retrieved lasts;

filtering means for filtering digitally the time-reversed signal, and for generating a filtered time-reversed signal in response to the filtering, the filtering means having at least one pole selected to equalize the digital signal by flattening the group delay of the digital signal;

second memory means for storing the filtered time-reversed signal in a forward sequence such that a first sample within the filtered time-reversed signal is stored first, and a last sample within the filtered time-reversed signal is stored last; and retrieving means for generating a substantially symmetric signal by retrieving the filtered time-reversed signal from the second memory means in a reverse sequence such that a last sample within the filtered time-reversed signal is stored first, and a first sample within the filtered time-reversed signal is stored last.

13. The device of claim 12 wherein said filtering means is a digital IIR filter.

14. The device of claim 12 further including:

digitizing means for digitizing an analog signal, and for generating said digital signal in response to the analog signal.

15. The device of claim 14 further including:

analog filter means for filtering analogically a burstwise signal, and for generating said analog signal in response thereto, the analog signal being on asymmetric signal, and said output signal being a substantially symmetric signal.

16. The device of claim 15 further including:

multiplying means for multiplying a cellular signal by a down conversion frequency signal and for generating said burstwise signal in response to the multiplying, the multiplying means being coupled to said filtering means; and generating means for generating said down conversion frequency signal, the generating means being coupled to said multiplying means.

17. The device of claim 16 further including:

receiving means for receiving said cellular signal, the receiving means being coupled to said multiplying means.

* * * * *